United States Patent [19]
Fujita et al.

[11] Patent Number: 6,008,935
[45] Date of Patent: Dec. 28, 1999

[54] OPTICAL AMPLIFIER AND OPTICAL AMPLIFIER GAIN CONTROL METHOD AND APPARATUS

[75] Inventors: Masayuki Fujita; Miwa Saeki, both of Tokyo, Japan

[73] Assignee: NEC Corporation, Tokyo, Japan

[21] Appl. No.: 08/987,840

[22] Filed: Dec. 9, 1997

[30] Foreign Application Priority Data

Dec. 10, 1996 [JP] Japan ................................ 8-329802

[51] Int. Cl.$^6$ ........................................................ H01S 3/00
[52] U.S. Cl. ........................................ 359/341; 359/134
[58] Field of Search ..................................... 359/341, 134

[56] References Cited

U.S. PATENT DOCUMENTS

| | | | |
|---|---|---|---|
| 5,706,126 | 1/1998 | Fujita | 359/341 |
| 5,784,192 | 7/1998 | Sugiyama et al. | 359/341 |
| 5,808,785 | 9/1998 | Nakabayashi | 359/341 |
| 5,828,486 | 10/1998 | Yoshida | 359/341 |
| 5,859,725 | 1/1999 | Sugiya et al. | 359/341 |
| 5,861,980 | 1/1999 | Ono | 359/341 |
| 5,864,423 | 1/1999 | Kosaka | 359/341 |
| 5,896,221 | 4/1999 | Saeki | 359/341 |

*Primary Examiner*—Mark Hellner
*Attorney, Agent, or Firm*—Whitham, Curtis & Whitham

[57] ABSTRACT

An optical amplifier for amplifying and outputting an input light signal, comprises an optical light amplifier unit (10), a tunable wavelength filter (30), a signal light detection unit, and a control circuit (100). The optical amplifier unit (10) amplifies the input light signal and outputs an amplified light signal. The tunable wavelength filter (30), into which the amplified light signal is inputted and which transmission light wavelength is swept, outputs a filter output signal. The signal light detection unit detects a signal light level of an amplified output component in the amplified light signal in response to said input light signal. The control circuit (100) controls a gain of said optical amplifier unit based on the signal light level. Further, the signal light detection unit of the optical amplifier according to the present invention comprises a peak detection unit (60) and a background light detection unit (70). The peak detection unit (60) detects a peak light level of the filter output signal. The background light detection unit (70) detects a background light level of the filter output signal.

37 Claims, 7 Drawing Sheets

OPTICAL AMPLIFIER AND OPTICAL AMPLIFIER GAIN CONTROL METHOD AND APPARATUS

BACKGROUND OF THE INVENTION

1. Field of the Invention

The present invention relates to an optical amplifier for use in optical communication and optical information processing. Particularly, the present invention relates to an optical amplifier capable of maintaining amplified signal light level to a constant level at high precision.

2. Description of the Related Art

In the long distance optical communication system, it is common to adopt a system for inserting an optical amplifier into an optical fiber transmission system as means for extending a transmission length. In the optical distribution system for distributing a light signal to various locations, an optical amplifier has been widely used for compensating for a distribution loss.

Conventionally, as a light amplifier for directly amplifying a light signal, an optical fiber amplifier using a rare-earth doped optical fiber as an amplifying medium and a semiconductor optical amplifier using stimulated emission phenomenon within a semiconductor device have been well-known. At present, the optical fiber amplifier is commercially well-known.

If such an optical amplifier is used in, for example, an optical transmission equipment, it is required to maintain constant a light signal level in every part of the system for purposes of stabilizing transmission characteristics. Due to this, it is said to be necessary to provide a function of keeping constant the signal light output of the optical amplifier inserted into the transmission path.

Conventionally, as ways to control the signal light output power of the optical amplifier to be constant, there has been proposed a method for monitoring the entire output light power of the optical amplifier and controlling the power to be constant. Generally, however, amplified spontaneous emission as well as an amplified signal light is outputted from the optical amplifier. The ratio of the spontaneous emission to the entire light power varies according to the input light power. The optical amplifier output power monitoring method used in the above-stated control method cannot measure an output signal light level at high precision due to the influence of the spontaneous emission. Accordingly, even if the optical amplifier unit is controlled to make the output light level of the optical amplifier constant, it is difficult to maintain constant the signal light output level. As ways to reduce the influence of spontaneous emission, there has been proposed means for eliminating spontaneous emission using an optical filter. However, the optical filter cannot eliminate a component having the same wavelength as that of the signal light. Due to this, even with such an optical filter, it is impossible to completely avoid the influence of spontaneous emission.

Even in case no signal light is inputted into the optical amplifier unit, spontaneous emission is outputted from the optical amplifier unit and it is impossible to determine whether or not a signal light is present from the result of monitoring the output power of the optical amplifier. Due to this, it is necessary to add means for detecting whether or not a signal light is present to the input of the optical amplifier unit so as to operate the optical amplifier only in case the signal light is inputted. As a result, the number of optical components constituting the optical amplifier increases.

SUMMARY OF THE INVENTION

It is therefore a first object of the present invention to realize an optical amplifier capable of making the output of a signal light constant at high precision without the influence of spontaneous emission.

It is a second object of the present invention to provide an optical amplifier capable of correctly calculating a noise figure by precisely measuring signal light power and spontaneous emission power from the output light of the optical amplifier.

The optical amplifier according to the present invention for amplifying a signal light and outputting an amplified light signal, comprises an optical splitter for branching part of the amplified signal light and for outputting a branched amplified light signal; a tunable wavelength filter for transmitting a component of a specific wavelength of the light branched by the optical splitter; a sweeper for sweeping the transmission wavelength of the tunable wavelength filter within a specific wavelength range; and a photo detector for receiving a transmission light and for converting the transmission light into an electric signal. The optical amplifier further comprises a differential processing unit for differentiating the electric signal and for outputting a differential signal; peak detection means for detecting a peak level of the electric signal; and a first background light detection unit for detecting a level of a background light of the amplified light signal from the electric signal. The optical amplifier further comprises an arithmetic processing unit which detects a signal light level from the level difference between a first peak level and a first spontaneous emission level; and a first control circuit which controls the optical amplifier based on the first differential signal and the first level difference.

The optical amplifier according to the present invention also comprises a signal light determination unit for determining whether or not a signal light is present from a maximum value of the time-differential signal outputted by the differential processing unit; and a monitoring unit for monitoring the level of the amplified light signal based on the level difference.

Moreover, the optical amplifier according to the present invention has a function of shutting down the output of the optical amplifier unit if a signal light is not present based on the determination result of the signal light determination unit showing whether or not the signal light is present. In addition to the above-stated characteristics, the optical amplifier according to the present invention has a optical amplification control function of controlling the output of the optical amplifier such that the signal light level is constant.

The optical amplifier according to the present invention also comprises, at the input side, a differential processing unit for differentiating an electric signal and for outputting a differential signal; a peak detection unit for detecting a second peak level of the electric signal; a background light detection unit for detecting a background light level of the signal light from the electric signal and for detecting a second spontaneous emission level; and a second arithmetic processing unit for outputting a difference between the second peak level and the second spontaneous emission level. The control circuit calculates a gain of the optical amplifier from the ratio of the signal light level of the signal light inputted into the light amplifier to the amplified signal light level, and controls the optical amplifier such that the gain is constant. Furthermore, the optical amplifier according to the present invention comprises noise figure calculation means for calculating a noise figure from the first spontaneous emission level.

The optical amplifier according to the present invention comprises an optical amplification stop function of stopping the optical amplifier if no input signal light is present based on the determination result of the differential processing unit showing whether or not the signal input light is present. The optical amplifier according to the present invention comprises an optical amplification stop function of shutting down the output of the optical amplifier if an input signal light or an amplified signal light is not present; and an optical amplification stop function of stopping the optical amplifier if an input signal light is present and an amplified signal light is not present.

The above-stated tunable wavelength filter consists of an interference film filter using a dielectric multiple-layer film, a Fabry-Perot etalon, an optical waveguide or a fiber Bragg grating.

Here, the optical amplifier unit in the optical amplifier is characterized by comprising an optical fiber amplifier using a rare-earth doped optical fiber as an amplifying medium; and a semiconductor optical amplifier using stimulated emission phenomenon of a semiconductor.

BRIEF DESCRIPTION OF THE DRAWINGS

The above and other objects, features and advantages of the present invention will become more apparent from the following detailed description when taken in conjunction with the accompanying drawings wherein:

FIG. 3(*b*) shows an example of the spectrum of the output light of the optical amplifier according to the present invention;

FIG. 3(*c*) shows the output of the photo dector;

FIG. 3(*d*) shows an example of the operation of a differential processing unit included in the optical amplifier according to the present invention; and FIG. 3(*e*) shows an example of an output waveform at a background light detection unit included in the optical amplifier according to the present invention;

DETAILED DESCRIPTION OF THE PREFERRED EMBODIMENTS

Before describing the optical amplifier according to the present invention, the conventional optical amplifier will be described to make the present invention easily understood.

Figure 1:
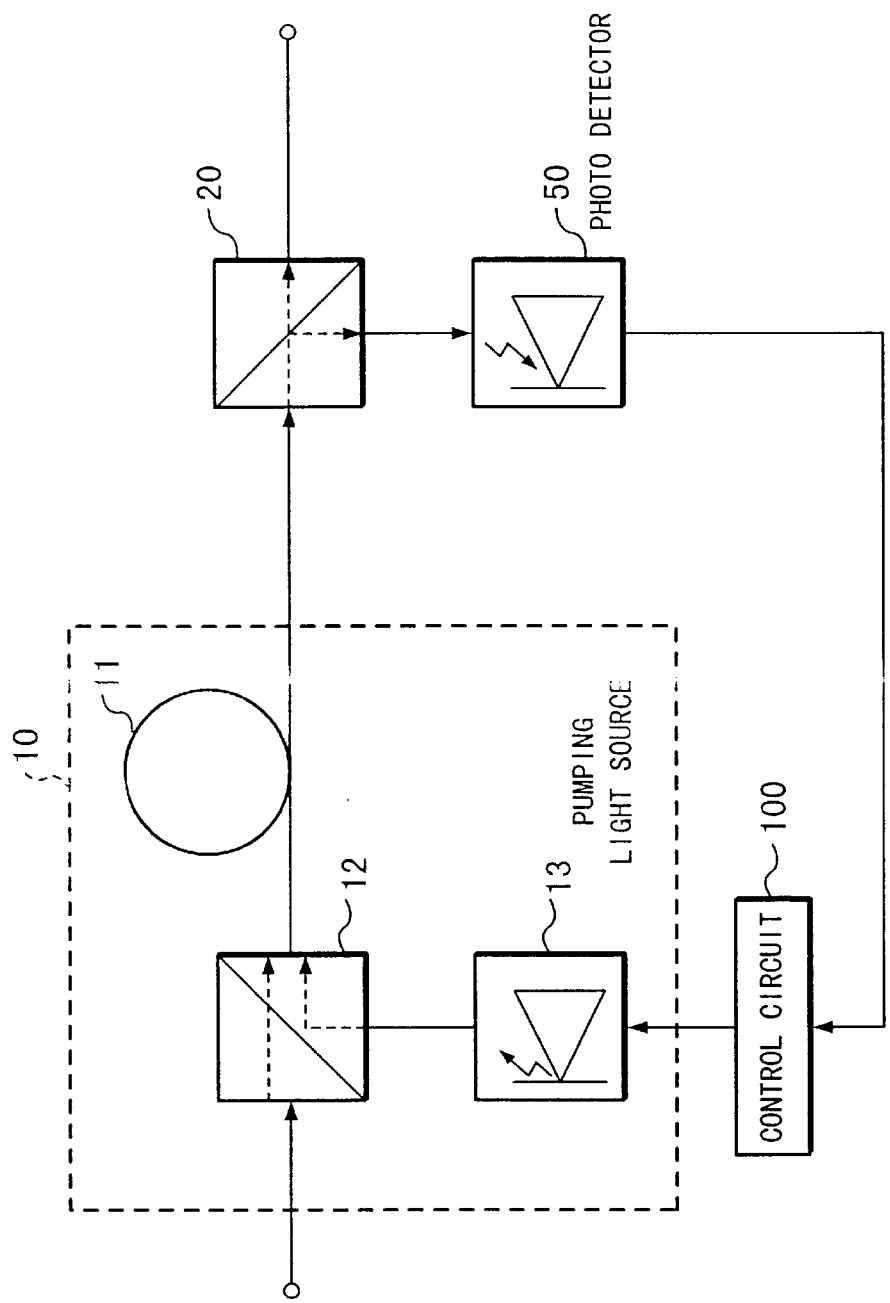
FIG. 1 is a block diagram showing the structure of the conventional optical amplifier.

FIG. 1 is an example of the structure of the conventional optical amplifier.

Conventionally, as an optical amplifier for directly amplifying a light signal, an optical fiber amplifier using a rare-earth doped optical fiber as an amplifying medium and a semiconductor optical amplifier using stimulated emission phenomenon within a semiconductor device have been well known.

If such an optical amplifier is used in, for example, an optical transmission equipment, it is required to maintain constant a light signal level in every part of the system for purposes of stabilizing transmission characteristics. Due to this, the optical fiber amplifier now commonly used is provided with an optical splitter 20 at the output of an optical amplifier 10 as shown in FIG. 1. Part of the output light of the optical amplifier 10 is branched by the optical splitter 20 and received by a photo detector 50. The pumping light output power is controlled to make the level of the received light constant.

Generally, however, amplified spontaneous emission as well as the amplified signal light is outputted from the optical amplifier. The ratio of the spontaneous emission to the entire light power varies according to the input light level. Thus, the optical amplifier output power monitoring method targeting at the entire light output power of the optical amplifier used in the above-stated control method cannot measure the level of the output signal light at high precision due to the influence of the spontaneous emission. Accordingly, even if the optical amplifier unit is controlled to make the output light level of the optical amplifier constant, it is difficult to keep constant the signal light output level. As ways to reduce the influence of spontaneous emission, there has been proposed means for eliminating spontaneous emission using an optical filter. However, even with the optical filter, the optical filter cannot eliminate a component having the same wavelength as that of the signal light. For that reason, it is impossible to completely get rid of the influence of spontaneous emission.

Even in case no signal light is inputted to the optical amplifier unit, spontaneous emission is outputted from the optical amplifier unit. It is therefore impossible to determine whether or not a signal light is present from the result of monitoring the output power of the optical amplifier. Due to this, it is necessary to add means for detecting whether or not a signal light is present to the input of the optical amplifier unit so as to amplify only the input signal light. If so, the number of optical components constituting the optical amplifier increases.

Figure 2:
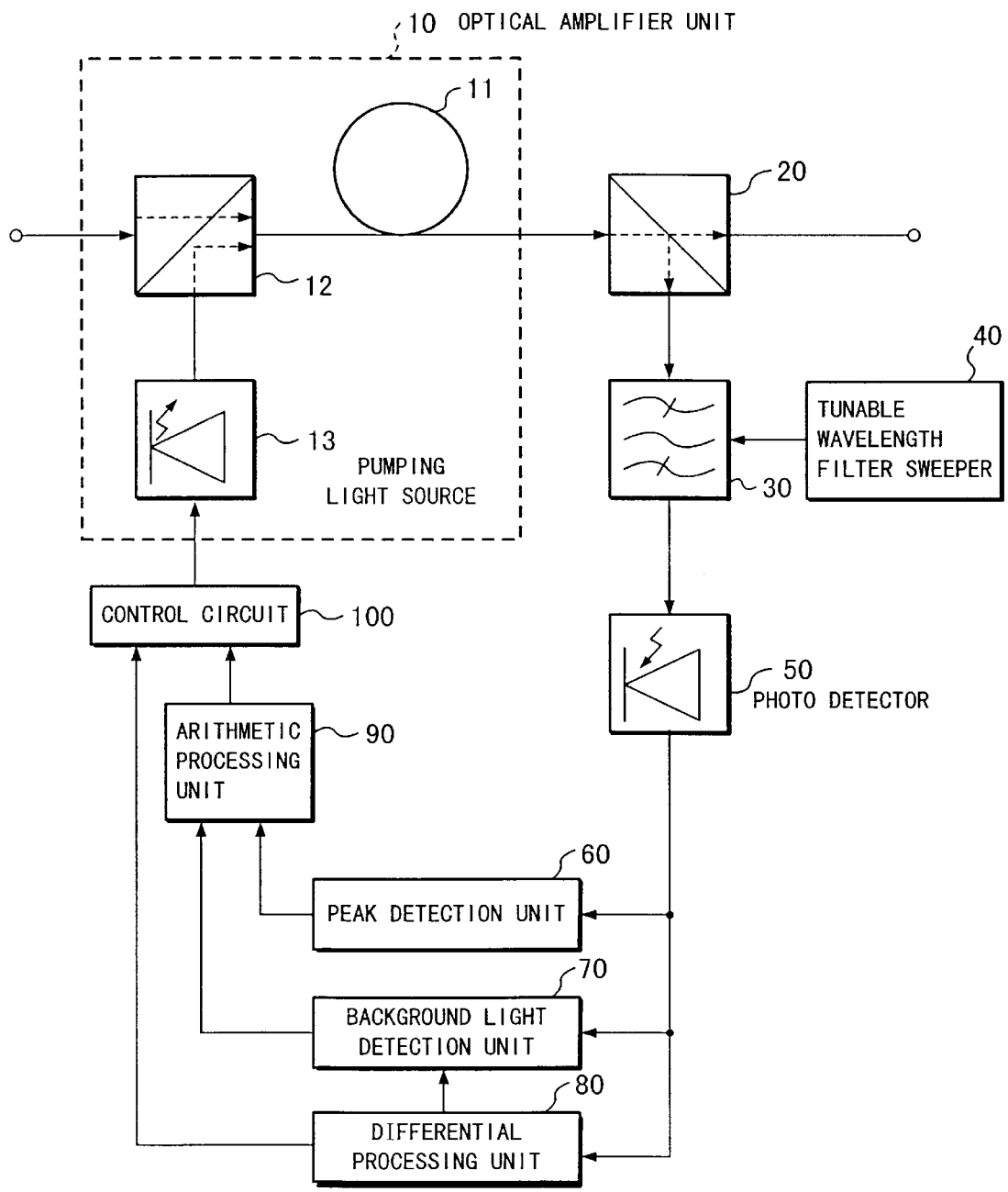
FIG. 2 is a block diagram showing the fundamental structure of the optical amplifier according to the present invention.

Next, description will be given to the fundamental structure of the optical amplifier according to the present invention as well as the operation principle thereof. FIG. 2 shows the fundamental structure of the optical amplifier according to the present invention.

As shown in FIG. 2, the optical amplifier according to the present invention comprises an optical amplifier unit 10, an optical splitter 20, a tunable wavelength filter 30, a sweeper 40, a photo detector 50, a peak detection unit 60, a background light detection unit 70, an arithmetic processing unit 90, a control circuit 100 and a differential processing unit 80. The optical amplifier unit 10 amplifies a signal light and outputs an amplified light signal. The optical splitter 20 branches part of the amplified signal light and outputs a branched amplified light signal. The tunable wavelength filter 30 transmits a specific wavelength component in the light branched by the optical splitter 20. The sweeper 40 sweeps a transmission wavelength of the tunable wavelength filter 30 within a range of specific wavelengths and outputs a transmitted light. The photo detector 50 receives the transmitted light from the tunable wavelength filter 30 and converts the transmitted light into an electric signal. The peak detection unit 60 detects the peak level of the electric signal. The background light detection unit 70 detects the level of the background light of the amplified light signal from the electric signal, and outputs the level of spontaneous emission. The arithmetic processing unit 90 detects the level of the signal light from the difference between the peak level and the spontaneous emission level. The control circuit 100 controls the optical amplifier unit 10 based on the difference between the peak level and the spontaneous emission level. The differential processing unit 80 differentiates the electric signal and determines whether or not a signal light is present from the maximum differential value.

With reference to FIGS. 2 and 3, the operation of the optical amplifier according to the present invention will be described in detail.

The output signal light amplified by the optical amplifier 10 is outputted to a light transmission path through the optical splitter 20. The output signal light branched by the optical splitter 20 is introduced into the photo detector 50 through the tunable wavelength filter 30. The output of the photo detector 50 is inputted into the peak detection unit 60, the background light detection unit 70 and the differential processing unit 80 which are connected in parallel. The arithmetic processing unit 90 calculates the level of the output signal light from the difference between the output of the peak detection unit 60 and that of the background light detection unit 70. The differential processing unit 80 determines whether or not a signal light is present from a maximum value of time-differentiated output of the photo detector 50. The control circuit 100 controls the output of the pumping light source 13 such that the power of the output signal light of the optical amplifier unit 10 is a predetermined constant value. When detecting that no signal light is inputted into the optical amplifier unit 10 from the output of the differential processing unit 80, the control circuit 100 stops the output of the pumping light source 13 and stops the operation of the optical amplifier unit 10.

Figure 3A:
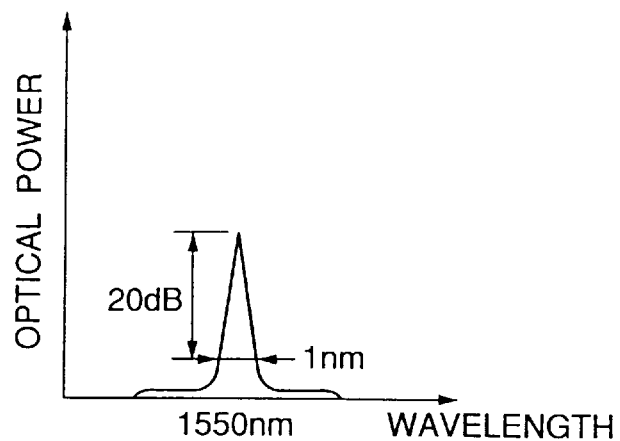
FIG. 3 are operation explanatory diagrams for showing operations of the optical amplifier according to the present invention, where FIG. 3(*a*) shows an example of the spectrum of a signal light inputted into the optical amplifier according to the present invention.

FIG. 3(a) is a spectrum of the signal light inputted into the optical amplifier unit 10 in the optical amplifier according to the present invention. Here, signal light power Pt (=Ps+ Pase) obtained by adding the amplified signal light power Ps and the spontaneous emission power. Pase generated within the optical amplifier unit, is outputted from the optical amplifier unit 10 (FIG. 3(b)).

Figure 3B:
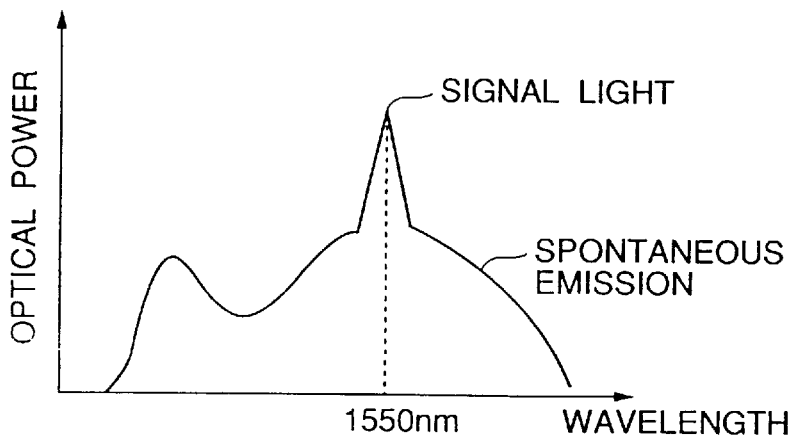
Figure 3C:
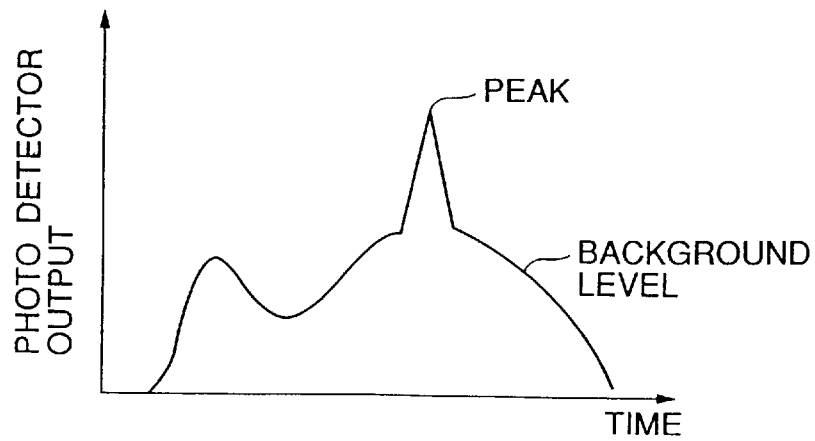

The optical splitter 20 branches the output light of the optical amplifier unit 10 and inputs part of the output of the branched light into the tunable wavelength filter 30. If the sweeper sweeps the transmission wavelength of the tunable wavelength filter 30, a variation in the light power with respect to a wavelength shown in FIG. 3(b), is shown as a time-series change in output current as shown in FIG. 3(c).

In other words, if the transmission wavelength of the tunable wavelength filter 30 coincides with the signal light wavelength, a sharp peak appears. If the transmission wavelength of the tunable wavelength filter 30 does not coincide with the signal light wavelength, only the spontaneous emission is incident on the photo detector 50 and appears as a background level of the output waveform of the photo detector 50.

Figure 3D:
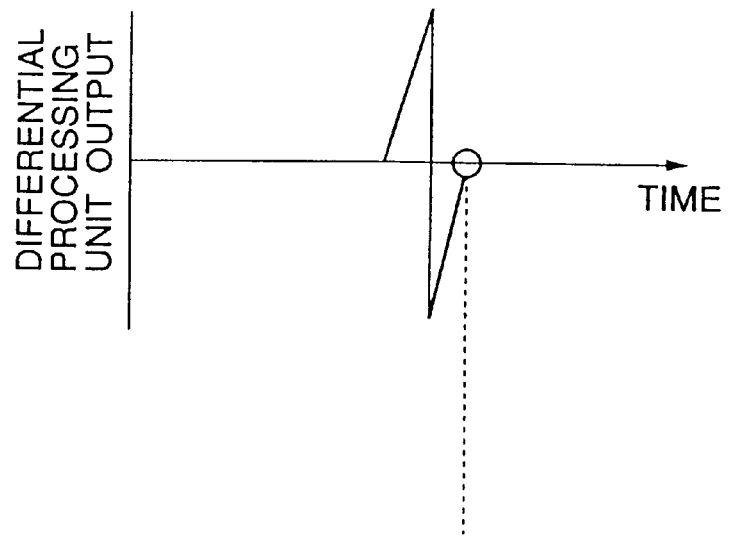

The differential processing unit 80 differentiates the output waveform of the photo detector 50. The wavelength obtained by differentiating the output of the photo detector 50 has a maximal value in the vicinity of the signal light peak as shown in FIG. 3(d). Therefore, by determining whether or not the differential waveform exceeds a specific value, it is possible to determine whether or not a signal light is present. The determination result is sent from the differential processing unit 80 to the control circuit 100.

Figure 3E:
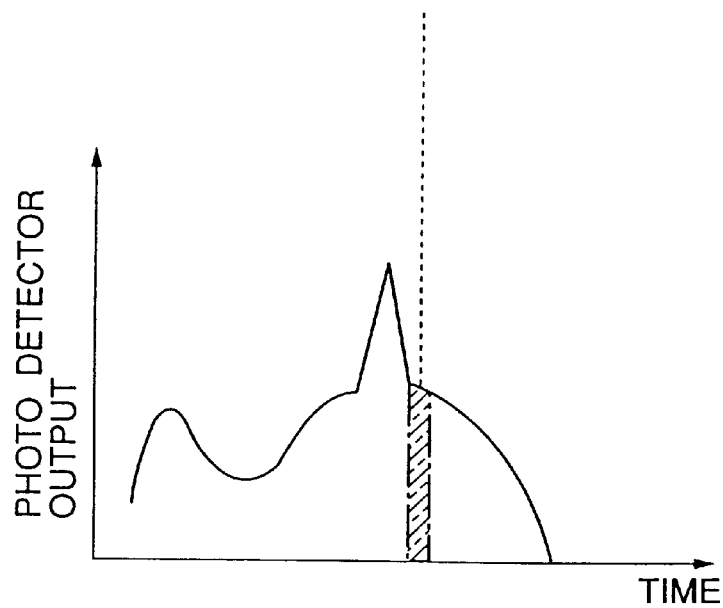

The peak detection unit 60 measures a peak level Pt of the output power of the photo detector 50 (FIG. 3(e)).

As shown in FIG. 3(e), the background light processing unit 70 measures the output level of the photo detector 50 after specific time has passed since the differential processing unit 80 detected the maximal value. The level is equivalent to the level of the background light in the vicinity of the signal light wavelength, that is, spontaneous emission power Pase which does not include the signal light. The peak level and the background light level are inputted into the arithmetic processing unit 90. Signal light power Ps is calculated from the Pt and Pase and inputted into the control circuit 100.

Figure 4:
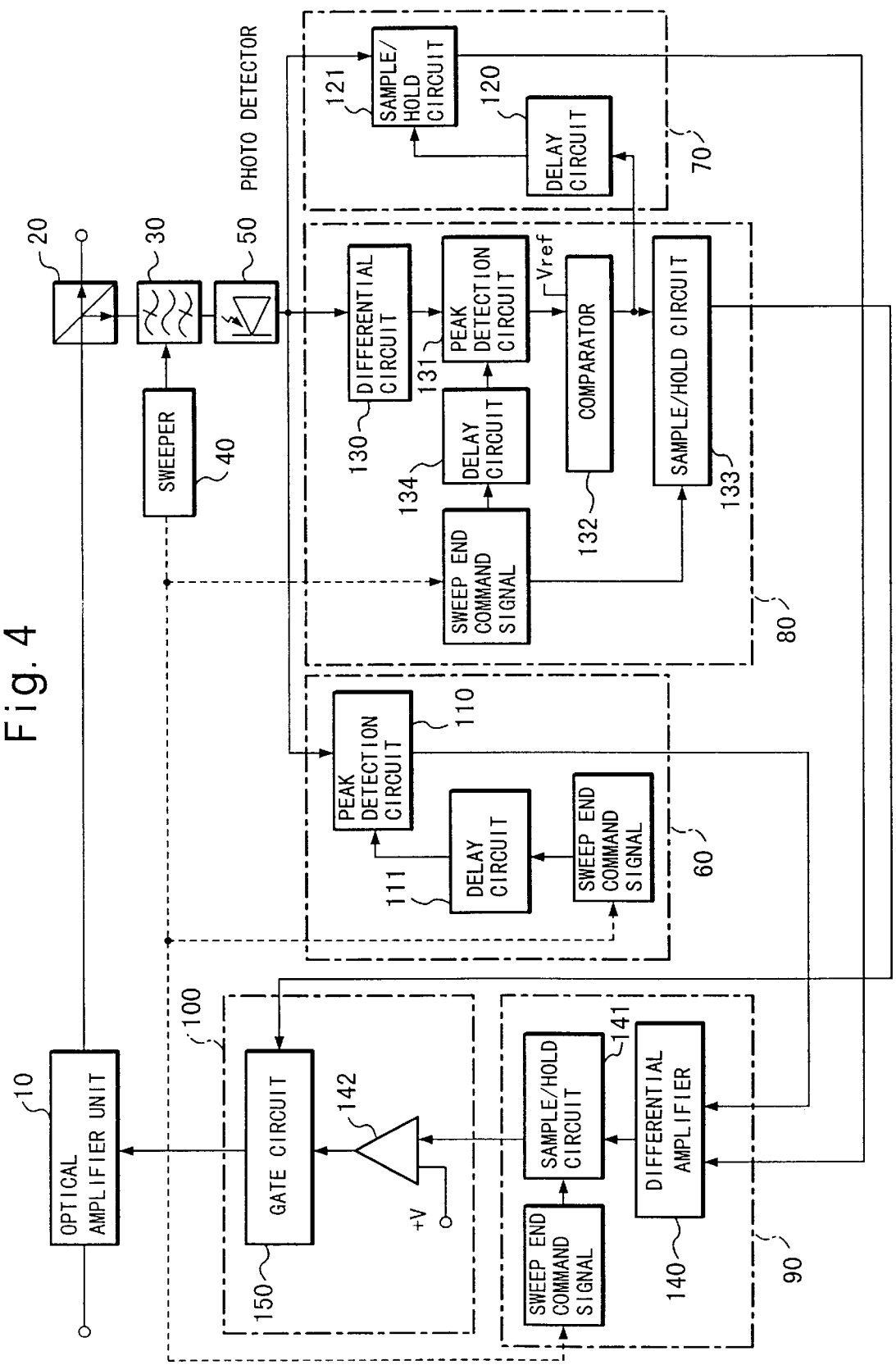
FIG. 4 is a block diagram showing the structure of the optical amplifier in a first embodiment according to the present invention.

Now, detailed description-will be given to the structure of the signal light monitoring part in the optical amplifier according to the present invention. FIG. 4 shows the structure of the first embodiment according to the present invention.

The signal light from the optical amplifier unit 10 is branched by the optical splitter 20 and introduced into the tunable wavelength filter 30. The transmission wavelengths within a specific range of the tunable wavelength filter 30 are swept by the sweeper 40 at a constant velocity V (nm/s). The light transmitted through the tunable wavelength filter 30 is detected by the photo detector 50 and inputted into a differential circuit 130 connected to the output of the photo detector 50. The differential circuit 130 time-differentiates the output of the photo detector 50. The peak value of the output of the differential circuit 130 is held by the peak detection circuit 131 and inputted into a comparator 132.

The comparator 132 compares a reference value Vref and an output Vpeak of the peak detection circuit 131. As a result of comparison, if Vref is equal to or less than Vpeak, an optional voltage Vo corresponding to a logical value "1" is outputted; otherwise, a voltage corresponding to a logical value "0" is outputted. Thus, it is determined whether or not a signal light is present. A sample/hold circuit 133 holds the output of the comparator 132 while using a sweep end signal from the sweeper 50 as a sample signal.

The peak detection circuit 131 is reset by the sweep end signal from the sweeper. A delay circuit 134 is inserted between the sweeper 40 and the peak detection circuit 131 so that a sweep end signal is inputted into the peak detection circuit 131 after a sweep end signal has been inputted into the sample/hold circuit 133. By so doing, the determination result of whether or not a signal light is present is outputted from the sample/hold circuit 133 until a next sweep period is finished, and the result is updated at the time when the next sweep period ends.

In the background light detection unit 70, the output of the comparator 132 functions as a sample signal and the output from the photo detector 50 is held by the sample/hold circuit 121. At this time, delay time at the delay circuit 120, which is inserted between the comparator 132 and the sample/hold circuit 121, is set to time t at which the transmission wavelength of the tunable wavelength filter passes through the wavelength of the signal light, whereby the level of the background light of the output of the photo detector 50 can be held in the sample/hold circuit 121.

The peak detection circuit 110 detects and holds a peak value of the output of the photo detector 50. The peak detection circuit 110 is delayed time period set by the delay circuit 111, in being reset after a sweep end signal is outputted from the sweeper 40.

The differential amplifier 140 subtracts the output Pase of the sample/hold circuit 121 from the output Pt of the peak detection circuit 110 and outputs a level corresponding to a pure signal light Ps passing through the optical splitter 20. The sample/hold circuit 141 holds the output of the differential amplifier 140 while making a sweep end signal from the sweeper 40 function as a sample signal. The output of the differential amplifier 140 is inputted into the control circuit 100. The control circuit 100 controls the level of the output light of the excitation light source 13 included in the optical amplifier unit 10 such that the output level of the differential amplifier 140 becomes a preset constant value.

In the control circuit 100, the differential amplifier 142 compares the output of the sample/hold circuit 141 with a reference voltage (+V). The differential amplifier 142 converts and outputs a difference between the output of the sample/hold circuit 141 with the reference voltage into an injection current applied to the pumping light source 13. The output of the differential amplifier 142 is inputted into a gate circuit 150. The output of the sample/hold circuit 133 is applied to the control input of the gate circuit 150. If the control input is a logical level "1", the input of the gate circuit 150 is outputted without change. If the control input is a logical level "0", the current output is set to 0.

To prevent the control circuit 100 for controlling the optical amplifier unit 10 from malfunctioning if the output of the sample/hold circuit 121 is changed during a sweep period by a variation in the power voltage, it is necessary to set the time constant for controlling the control circuit 100 to be sufficiently longer than the sweep period. To do so, an integral circuit is inserted between the differential amplifier 142 and the gate circuit 150 to thereby adjust the time constant.

The optical amplifier unit 10 consists of an Er-doped optical fiber 11 serving as an amplification medium, a WDM coupler 12 and the excitation light source 13. An optical fiber fused type branch unit is used as an optical splitter 20. The tunable wavelength filter 30 is of type of rotating a dielectric filter using a pulse stepping motor. A motor drive circuit for rotating the stepping motor at a constant rate is used as a sweeper 40. An InGaAs PIN photodiode is used as a photo detector 50.

A signal light of a central wavelength of 1550 nm and a 20 dB suppressed width of 1 nm is inputted into the light amplifier unit 10. The sweeping range of the transmission central wavelength of the tunable wavelength filter 6 is 1550 nm±5 nm. The 20 dB suppressed band width with respect to the transmission wavelength is 1 nm. The transmission wavelength of the tunable wavelength filter 30 is swept by the sweeper 40 at a rate of 10 nm/s. Therefore, time T required per sweeping operation is expressed as follows:

T=(Sweep Width 10 nm)/(Sweep Rate 10 nm/s)=1 s.

In addition, time DT at which the transmission wavelength of the tunable wavelength filter 30 passes through the signal light wavelength is expressed as follows:

DT=[(20 dB bandwidth of Signal light 1 nm)+(20 dB suppressed bandwidth of Tunable wavelength filter 1 nm)/(Sweep rate 10 nm/s)=0.2 s.

Based upon the above obtained values, the time constant of the control circuit 100 is set to 2 s and the delay time of the delay circuit 131 is set to 0.3 s.

In this embodiment, the optical fiber amplifier is used as an optical amplifier unit. However, it is possible to use a semiconductor optical amplifier as a optical amplifier unit.

As the tunable wavelength filter 30, a Fabry-Perot etalon, an optical waveguide, a fiber Bragg grating and the like can be used in addition to an interference film filter using a dielectric multiple-layer filter.

The sweeper 40 functions to sweep the transmission wavelength of the tunable wavelength filter 30. It goes without saying that various modifications can be made to the sweeper, depending on the drive mechanism of a tunable wavelength filter to be employed. For example, if a tunable wavelength filter is a Fabry-Perot etalon which uses an air gap as a cavity and changes the air gap of the Fabry-Perot etalon by a piezoelectric element and which consists of an applied voltage adjustment unit, it may be in the form of a carried current adjustment device for adjusting current carried through an electronic cooler.

Figure 5:
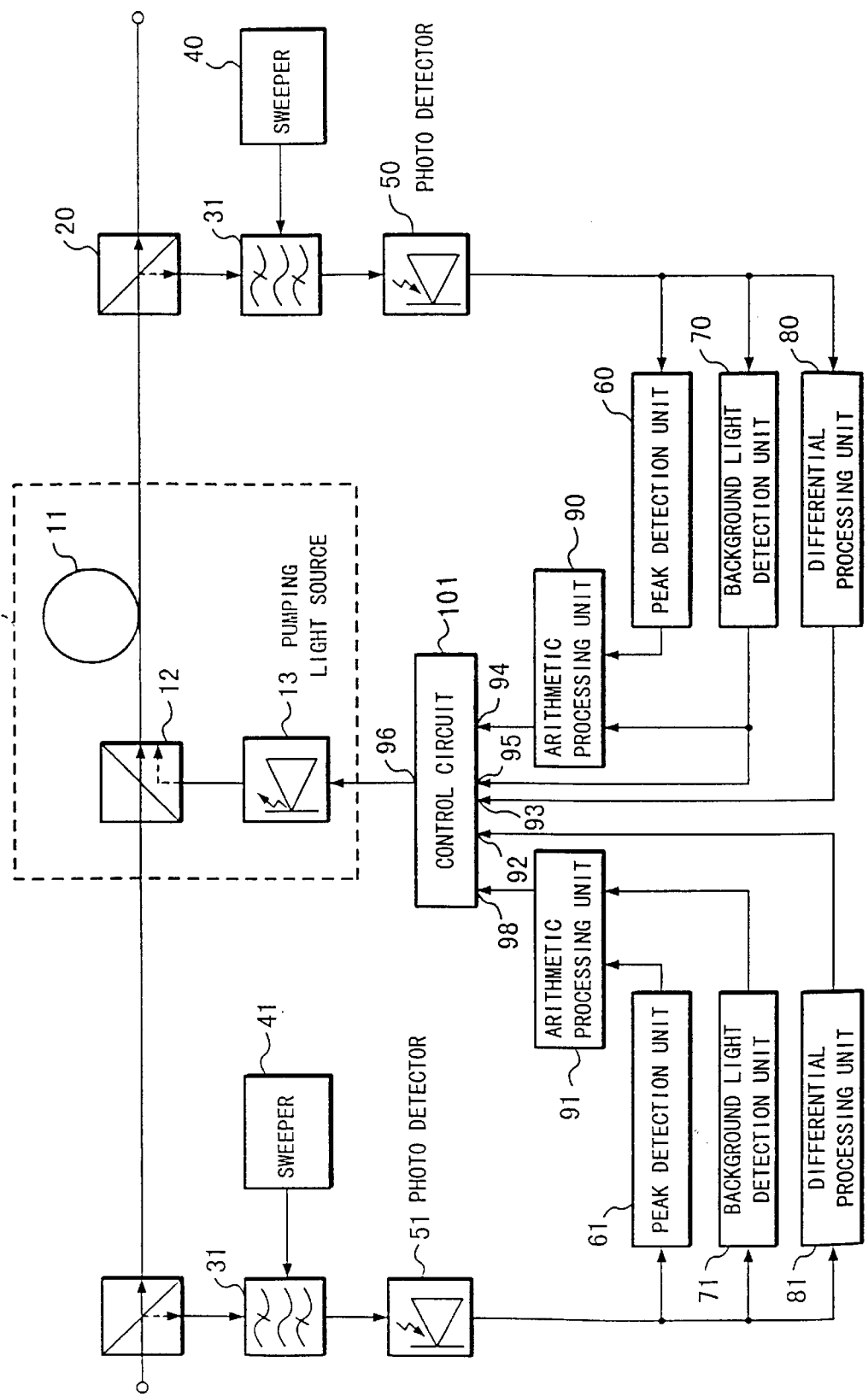
FIG. 5 is a block diagram showing the structure of the optical amplifier in a second embodiment according to the present invention.

Next, the optical amplifier in the second embodiment according to the present invention will be described with reference to FIG. 5.

In this embodiment, an optical splitter 21, a tunable wavelength filter 31, a sweeper 41, a photo detector 51, a peak detection unit 61, a background light detection unit 71, a differential processing unit 81 and an arithmetic processing unit 91 are added to the optical amplifier shown in FIG. 4.

The optical splitter 21 is inserted into the input part of a optical amplifier unit 10 and branches the light inputted into the optical amplifier. The tunable wavelength filter 31 transmits a specific wavelength component included in the light branched by the optical splitter 21. The sweeper 41 sweeps the transmission wavelength of the tunable wavelength filter 31 in a specific wavelength range. The photo detector 51 receives the transmission light of the tunable wavelength filter 31 and converts the light into an electric signal. The peak detection unit 61 measures the peak level of the light inputted into the optical amplifier in response to the output of the photo detector 51. The background light detection unit 71 measures the power of spontaneous emission included in the light inputted into the optical amplifier. The differential processing unit 81 determines whether or not a signal light is included in the input light. The arithmetic processing unit 81 calculates the power Pin of the input signal light based on the peak light power measured by the peak detection unit 61 and the spontaneous emission power measured by the background light detection unit 71.

Figure 6:
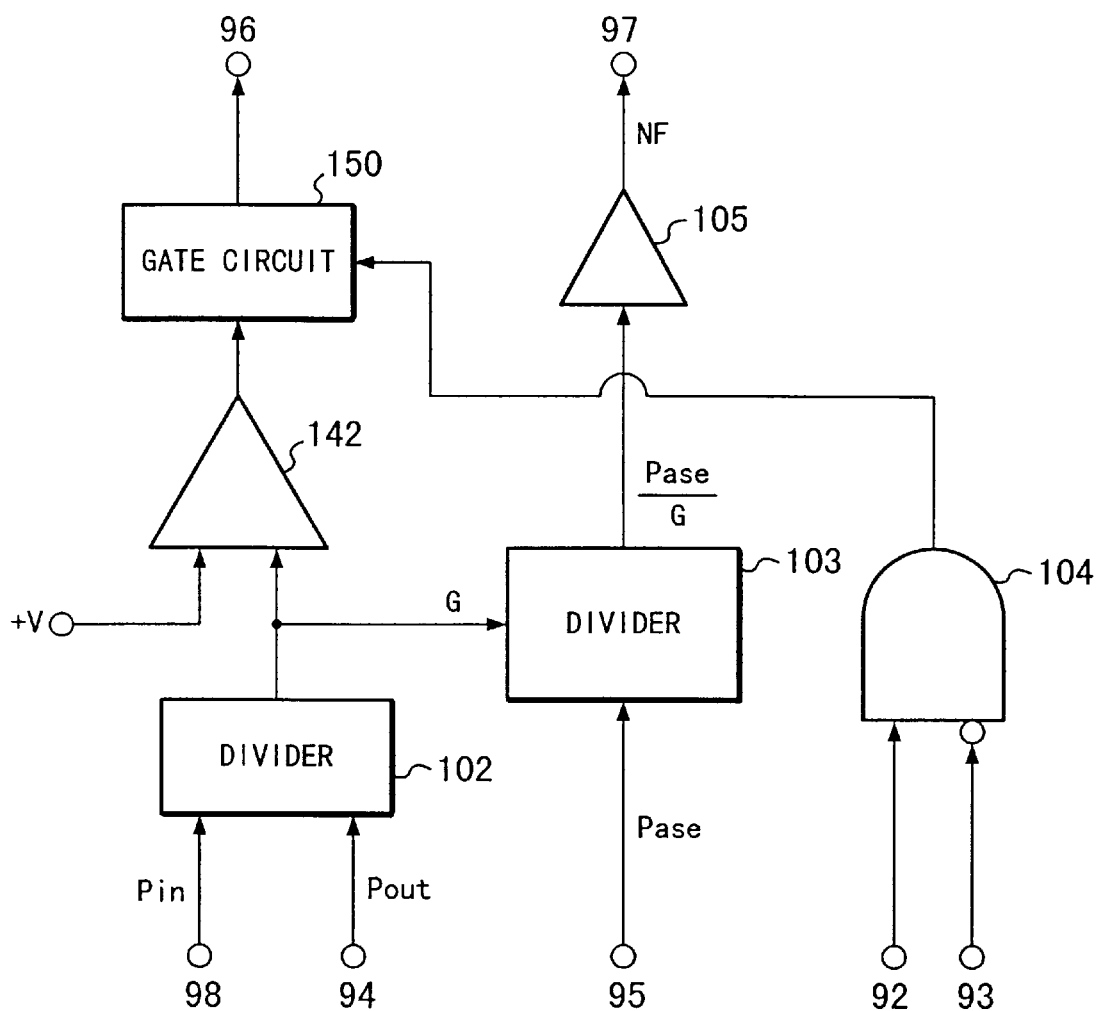
FIG. 6 is a block diagram showing the structure of a control circuit 101 used in the optical amplifier in second embodiment according to the present invention.

The control circuit 101 calculates a gain G of the optical amplifier unit 10 based on electric signals corresponding to the output signal light level Pout and the input signal light level Pin outputted from the arithmetic processing units 90 and 91, respectively. The control circuit 101 outputs the injection current of the excitation light source such that the gain G becomes a preset constant value. The control circuit 101 detects whether or not signal light is included in the input light and the output light, respectively from the outputs of the differential processing units 80 and 81. If the input light includes a signal light and the output light does not, the control circuit 101 determines that the optical amplifier unit 10 malfunctions and cuts off the output of the injection current. Furthermore, the control circuit 101 calculates and outputs a noise figure from the output Pase of the background light detection unit 70 and the gain G. The structure of the control circuit 101 is illustrated by FIG. 6. The Pin and Pout inputted from the input terminals 98 and 94, respectively are inputted into a divider 102. The divider 102 calculates and outputs G=Pout/Pin. The output of the divider 102 is inputted into a differential amplifier 142. The differential amplifier 142 converts a difference between the reference voltage +V and the input voltage into an injection current applied to the excitation light source 13. The output of the differential amplifier 142 is inputted into the gate circuit 150. The output of an AND circuit 104 is inputted into the control input of the gate circuit 150. If the control input is at a logical level "1", the input of the gate circuit 150 is output without change. If at a logical level "0", the current output is set to 0. An inversion of the signal applied to an input terminal 93 and a signal applied to an input terminal 92 are inputted to the AND circuit 104.

The signal (Pase) inputted from the input terminal 95 of the control circuit 101 as well as the output (G) of the divider 102 is inputted into a divider 103. The divider 103 calculates and outputs Pase/G. Since the noise figure (NF) of the optical amplifier is expressed by a formula below, the NF value can be obtained by inputting the output of the divider 103 into an amplifier 105 having a gain of $1/(h \times n \times Df)$:

$$NF = Pase/(h \times n \times Df \times G),$$

where h is a Planck's constant, n (=c/l, where c is the velocity of light) is a signal light frequency, Df ($= c \times Dl/l^2$, where Dl is a half width of the tunable wavelength filter 30) is a value of the transmission bandwidth of the tunable wavelength filter 30 converted into a frequency value and G (=Pout/Pin) is a gain of the optical amplifier unit 10.

The optical amplifier according to the present invention can obtain advantages as follows. The output level of the optical amplifier unit at the signal light wavelength and the level of the spontaneous emission in the vicinity of the signal light wavelength can be measured. Thus, it is possible to detect only a signal light component by obtaining the difference therebetween. Based on this, the output of the optical amplifier unit is controlled, whereby output is controlled to be constant at high precision.

Part of the light transmitted through the tunable wavelength filter and inputted to the photo detector is differentiated. By so doing, only the signal light can be detected from the magnitude of the differential output. Furthermore, only the optical splitter is inserted into the optical fiber transmission system. Due to this, the loss of the transmitted signal light propagated within the optical fiber transmission system can be prevented to a minimum. The output light of the optical amplifier unit is monitored. By so doing, it is possible to easily realize an optical amplifier having a function to shut down the operation of the optical amplifier unit if no output signal light is present.

Optical splitters are inserted into the input and output of the optical amplifier unit, respectively and the input light and the output light of the optical splitters are monitored, respectively. By so doing, it is possible to easily realize a optical amplifier having the following functions: a function of stopping the operation of the optical amplifier unit if no input signal light is present; a function of determining the malfunction of the optical amplifier unit if a signal light is included in the input light signal and not included in the output light signal; and a function of calculating a noise figure from the gain from the input and output signal light and from the level of the spontaneous emission in the vicinity of the signal light.

While this invention has been described in connection with certain preferred embodiments, it is to be understood that the subject matter encompassed by way of this invention should not be limited to those specific embodiments. On the contrary, it is intended for the subject matter of the invention to include all alternatives, modifications and equivalents as can be included within the spirit and scope of the following claims.

What is claimed is:

1. An optical amplifier, comprising:

an optical amplifier circuit which amplifies an input light signal and outputs an amplified light signal;

an optical filter into which said amplified light signal is inputted, said optical filter detecting a signal light level of an amplified output component in said amplified light signal in response to said input light signal; and a first control circuit which controls a rain of said optical amplifier circuit based on the signal light level, wherein said optical filter comprises:
a first tunable filter, into which said amplified light signal is inputted and whose transmission light wavelength is swept, for outputting a first filter output signal; and
a first signal light detection circuit for detecting said signal light level of the amplified output component in said amplified light signal in response to said input light signal by using the first filter output signal.

2. An optical amplifier according to claim 1, wherein said first light signal detection circuit comprises:
a first peak detection circuit for detecting a first peak light level of said first filter output signal; and
a first background light detection circuit for detecting a first background light level of said first filter output signal.

3. An optical amplifier according to claim 2, wherein said optical amplifier further comprises:
a first differential processing circuit for differentiating said first filter output signal and outputting a first differential signal;
a signal light determination circuit for determining whether or not an amplified output component in response to said input light signal, from said first differential signal; and
a first arithmetic processing circuit for detecting said signal light level based on a difference between said first peak light level and said first background light level.

4. An optical amplifier according to claim 3, wherein said light amplifier further comprises an optical amplification stop circuit for shutting down operation of the optical amplifier circuit if no amplified output component in response to said input light signal is present.

5. An optical amplifier according to claim 1, wherein said optical amplifier further comprises:
an optical amplification control circuit for controlling an output of the optical amplifier circuit such that a level of the amplified output component in response to said input light signal is constant.

6. An optical amplifier according to claim 2, wherein said optical amplifier further comprises:
a second tunable wavelength filter, into which said input light signal is inputted and which transmission light wavelength is swept, for outputting a second filter output signal;
a second signal light detection circuit for detecting said input light signal level using the second filter output signal;
a second differential processing circuit for differentiating said second filter output signal, and for outputting a second differential signal; and
an input signal light determination circuit for determining whether or not said input signal light is present from said second differential signal.

7. An optical amplifier according to claim 6, wherein said second signal light detection circuit comprises:
   a second peak detection circuit for detecting a peak light level of said second filter output signal; and
   a second background light detection circuit for detecting a second background light level from said second filter output signal.

8. An optical amplifier according to claim 7, wherein said light amplifier further comprises:
   a second arithmetic processing circuit for outputting a difference between said input light signal level and said second background light level.

9. An optical amplifier according to claim 6, wherein said control circuit further comprises:
   a optical amplification control circuit, into which an output of said second signal light detection circuit is inputted, for calculating a gain of said optical amplifier circuit from a ratio of a signal light level of the signal light inputted into said optical amplifier circuit to a level of said amplified signal light, and for controlling said optical amplifier circuit such that the gain is constant.

10. An optical amplifier according to claim 6, wherein said optical amplifier further comprises:
    a noise figure calculation circuit for calculating a noise figure from said gain and said first background light level.

11. An optical amplifier according to claim 6, wherein said optical amplifier further comprises:
    an optical amplification stop circuit for stopping an operation of said optical amplifier circuit if no input signal light is present, based on a determination result of the second differential processing circuit showing whether or not the input signal light is present.

12. An optical amplifier according to claim 6, wherein said optical amplifier further comprises:
    an optical amplification stop circuit for stopping an operation of said optical amplifier circuit if the input signal light or the amplified signal light is present, based on determination results of said first differential processing circuit and said second differential processing circuit showing whether or not the input signal light is present and whether or not the amplified signal light is present, respectively.

13. An optical amplifier according to claim 6, wherein said optical amplifier further comprises:
    an optical amplification stop circuit for stopping an operation said optical amplifier circuit if the input signal light is present and the amplified signal light is not present, based on determination results of said first differential processing circuit and said second differential processing circuit showing whether or not the input signal light is present and whether or not the amplified signal light is present, respectively.

14. An optical amplifier according to claim 1, wherein said first tunable wavelength filter includes an interference film filter using a dielectric multiple-layer film.

15. An optical amplifier according to claim 1, wherein said first tunable wavelength filter includes a Fabry-Perot etalon.

16. An optical amplifier according to claim 1, wherein said first tunable wavelength filter includes an optical waveguide.

17. An optical amplifier according to claim 1, wherein said first tunable wavelength filter includes a fiber Bragg grating.

18. An optical amplifier according to claim 1, wherein said optical amplifier circuit includes an optical fiber amplifier circuit using a rare-earth doped optical fiber as an amplification medium.

19. An optical amplifier according to claim 1, wherein said optical amplifier circuit includes a semiconductor optical amplifier using induced emission phenomenon of a semiconductor.

20. An optical amplifier gain control method, comprising:
    a step of detecting a signal light level of an amplified output component in response to an input light signal from an amplified light signal outputted from a optical amplifier, said optical amplifier being a control target; and
    a gain control step of controlling a gain of said optical amplifier based on the signal light level,
    wherein said signal light level detection step comprises:
       a first analysis step of analyzing a spectrum of said amplified light signal with respect to an optical wavelength, said spectrum including a range of wavelengths selected relative to said optical wavelength; and
    a step of detecting a signal light level from the spectrum of the amplified signal light spectrum obtained as a result of the first analysis step.

21. An optical amplifier gain control method according to claim 20, wherein said method further comprising the steps of:
    determining whether or not said amplified output component is present from the signal level obtained as a result of said first analysis step; and
    shutting down said optical amplifier if said amplified output component is not present.

22. An optical amplifier gain control method according to claim 21, wherein said method further comprises the steps of:
    detecting a power of said input light signal;
    calculating a gain of said optical amplifier using a power of said amplified output component; and
    controlling the gain of said optical amplifier such that the gain is a preset constant value.

23. An optical amplifier gain control method according to claim 22, wherein said method further comprises the steps of:
    detecting whether or not said input light signal is present; and
    shutting down said optical amplifier if said input light signal is present and said amplified output component is not present.

24. An optical amplifier gain control apparatus, comprising:
    an optical filter, into which an amplified light signal outputted from an optical amplifier is inputted, said light amplifier being a control target, for detecting a signal light level o an amplified output component in said amplified light signal in response to said input light signal; and
    a first control circuit for controlling a gain of said optical amplifier based on the signal light level,
    wherein said optical filter comprises:
       a first tunable wavelength filter, into which said amplified light signal is inputted and which transmission wavelength is swept, for outputting first filter output signal; and
       a first signal light detection circuit for detecting said signal light level of the amplified output component in said amplified light signal in response to said input light signal.

25. An optical amplifier gain control apparatus according to claim 24, wherein said first signal light detection circuit comprises:

a first peak detection circuit for detecting a first peak light level of said first filter output signal; and a first background light detection circuit for detecting a first background light level of said first filter output signal.

26. An optical amplifier gain control apparatus according to claim 28, wherein said apparatus further comprises:

A first differential processing circuit for differentiating said first filter output signal, and for outputting a first differential signal;

a signal light determination circuit for determining whether or not an amplified output component in response to said input light signal from said first differential signal; and a first arithmetic processing circuit for detecting said signal light level from a difference between said first peak light level and said first background light level.

27. An optical amplifier gain control apparatus according to claim 26, wherein said apparatus further comprises:

an optical amplification stop circuit for stopping an operation of a light amplifier circuit if the amplified output component in response to said input light signal is not present, based on a determination result of said signal light determination circuit showing whether or not the signal light is present.

28. An optical amplifier gain control apparatus according to claim 24, wherein said apparatus further comprises:

an optical amplifier control circuit for controlling an output of an optical amplifier circuit such that the amplified output component in response to said input light signal is constant.

29. An optical amplifier gain control apparatus according to claim 25, wherein said apparatus further comprises:

a second tunable wavelength filter, into which said input light signal is inputted and which transmission light wavelength is swept, for outputting a second filter output signal;

a second signal light detection circuit for detecting said input light signal by using the second filter output signal;

a second differential processing circuit for differentiating said second filter output signal, and for outputting a second differential signal; and an input signal light determination circuit for determining whether or not said input signal light is present from said second differential signal.

30. An optical amplifier gain control apparatus according to claim 29, wherein said second signal light detection circuit comprises:

a second peak detection circuit for detecting a peak light level of said second filter output signal; and a second background light detection circuit for detecting a second background light level from said second filter output signal.

31. An optical amplifier gain control apparatus according to claim 30, wherein said apparatus further comprises:

a second arithmetic processing circuit for outputting a difference between said input light signal level and said second background light level.

32. An optical amplifier gain control apparatus according to claim 29, wherein said apparatus further comprises:

an optical amplification control circuit, into which an output of said signal light detection circuit is inputted, for calculating a gain of said optical amplifier circuit from a ratio of a signal light level of a signal light inputted into said optical amplifier circuit to a level of said amplified signal light, and for controlling said optical amplifier circuit such that the gain is constant.

33. An optical amplifier gain control apparatus according to claim 29, wherein said apparatus further comprises:

an optical amplification stop circuit for stopping said optical amplifier circuit if the input signal light is not present, based on a determination result of the second differential processing circuit showing whether or not the input signal light is present.

34. An optical amplifier gain control apparatus according to claim 29, wherein said apparatus further comprises:

an optical amplification stop circuit for stopping said optical amplifier circuit if the input signal light or the amplified signal light is present, based on determinations results of said first differential processing circuit and said second differential processing circuit showing whether or not the input signal light is present and whether or not the amplified signal light is present, respectively.

35. An optical amplifier gain control apparatus according to claim 29, wherein said apparatus further comprises:

an optical amplification stop circuit for stopping said optical amplifier circuit if the input signal light is present and the amplified signal light is not present, based on determination results of said first differential processing circuit and said second differential processing circuit showing whether or not the input signal light is present and whether the amplified signal light is present, respectively.

36. An optical amplifier gain control method according to claim 27, further comprising:

a step of detecting a noise component in the spectrum of the amplified signal light based on an analysis of wavelengths within said spectrum.

37. An optical amplifier gain control method according to claim 36, wherein said detecting step includes detecting said noise component based on an analysis of wavelengths other than said optical wavelength within said spectrum.

* * * * *